United States Patent
Asnaashari et al.

(10) Patent No.: US 9,213,495 B2
(45) Date of Patent: *Dec. 15, 2015

(54) CONTROLLER MANAGEMENT OF MEMORY ARRAY OF STORAGE DEVICE USING MAGNETIC RANDOM ACCESS MEMORY (MRAM) IN A MOBILE DEVICE

(71) Applicant: Avalanche Technology, Inc., Fremont, CA (US)

(72) Inventors: Mehdi Asnaashari, Danville, CA (US); Siamack Nemazie, Los Altos Hills, CA (US)

(73) Assignee: AVALANCHE TECHNOLOGY, INC., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/498,717

(22) Filed: Sep. 26, 2014

(65) Prior Publication Data

US 2015/0032947 A1 Jan. 29, 2015

Related U.S. Application Data

(63) Continuation of application No. 14/192,444, filed on Feb. 27, 2014, now Pat. No. 8,929,146, which is a continuation of application No. 13/952,435, filed on Jul. 26, 2013, now Pat. No. 8,724,392.

(51) Int. Cl.
*G11C 11/34* (2006.01)
*G11C 16/06* (2006.01)
*G06F 3/06* (2006.01)

(52) U.S. Cl.
CPC .............. *G06F 3/0646* (2013.01); *G06F 3/061* (2013.01); *G06F 3/0604* (2013.01); *G06F 3/0614* (2013.01); *G06F 3/0631* (2013.01); *G06F 3/0644* (2013.01); *G06F 3/0685* (2013.01); *G06F 3/0688* (2013.01); *G06F 2003/0697* (2013.01)

(58) Field of Classification Search
CPC ... G06F 3/0685; G06F 3/0646; G06F 3/0604; G06F 3/061; G06F 3/0614; G06F 3/0631; G06F 3/0444; G06F 3/0688; G06F 2003/0697
USPC .............. 365/185.17, 158; 711/103, E12.008
See application file for complete search history.

(56) References Cited

U.S. PATENT DOCUMENTS

| | | | |
|---|---|---|---|
| 5,778,418 A | 7/1998 | Auclair et al. | |
| 8,724,392 B1 * | 5/2014 | Asnaashari et al. | ..... 365/185.17 |
| 2013/0019058 A1 | 1/2013 | Caraccip et al. | |
| 2013/0151761 A1 | 6/2013 | Kim et al. | |

FOREIGN PATENT DOCUMENTS

WO  WO 2008000088  1/2008

* cited by examiner

*Primary Examiner* — Toan Le
(74) *Attorney, Agent, or Firm* — Maryam Imam; IPxLaw Group LLP

(57) ABSTRACT

A mass storage device includes a controller configured to communicate with a host. The controller is coupled to a first memory and a second memory, the first and second memories being of different types. The mass storage device includes a storage media partitioned into a plurality of Logical Units (LUNs) based on capabilities and resources of the mass storage device. The mass storage device further includes the first memory and the second memories and a hybrid reserved area spanning at least a portion of the first and second memories.

20 Claims, 18 Drawing Sheets

CONTROLLER MANAGEMENT OF MEMORY ARRAY OF STORAGE DEVICE USING MAGNETIC RANDOM ACCESS MEMORY (MRAM) IN A MOBILE DEVICE

CROSS REFERENCE TO RELATED APPLICATIONS

This application is a continuation of U.S. application Ser. No. 14/192,444, filed by Mehdi Asnaashari, on Feb. 27, 2014, and entitled "CONTROLLER MANAGEMENT OF MEMORY ARRAY OF STORAGE DEVICE USING MAGNETIC RANDOM ACCESS MEMORY (MRAM)", which is a continuation of U.S. patent application Ser. No. 13/952,435, filed by Mehdi Asnaashari, on Jul. 26, 2013, and entitled "CONTROLLER MANAGEMENT OF MEMORY ARRAY OF STORAGE DEVICE USING MAGNETIC RANDOM ACCESS MEMORY (MRAM)", the disclosure which is incorporated by reference as though set forth in full.

BACKGROUND OF THE INVENTION

1. Field of the Invention

The invention relates generally to a storage device and particularly to management of the memory array of storage device by a controller.

2. Description of the Prior Art

Memory media in a mass storage device is used partially by the controller of the device to store a variety of types of private data, i.e. data that is not intended for public access and is rather intended for a very limited access, in the memory media, that are critical to the device's performance and reliability. Examples of such data include boot code and tables, among others. The controller uses the rest of the memory media to store data from a host. Some of the data from the host are frequently accessed and are also critically important to the performance of the host incorporating the mass storage device. Hence the controller's efficient management of these data is most critical in optimizing the mass storage device's performance as well as providing pleasant user experience.

Controller private data, such as boot code, is not very large compare with user data but it requires a reliable storage media. Another example of private data is tables that are managed by the controller to locate logical block addresses within the memory array physical block addresses. These tables are most critical to functionality and performance of the device and are frequently accessed, as such they require media with high performance, reliability, and non-volatility.

Controllers sometimes store security parameters such as AES keys in their private data area which also requires reliable media. The security keys are used to protect the data of the memory array (part of the memory media) of the mass storage device. Any corruption of the keys will most likely render the storage device useless.

Certain host parameters, such as file allocation table (FAT) and directories are accessed and updated frequently as well and require a memory media type with high performance and high reliability for optimal performance. Other types of host data such as pictures, songs and movies typically require a very large amount of storage and occupy the majority of the memory media of the storage device but they do not require as reliable nor high performance by the memory media.

Current mass storage devices commonly utilize NAND flash memories for the storage media. NAND memories provide large amounts of storage at a reasonable price point but they fail to provide all the attributes required by the controller for achieving high performance and reliable system. NAND flash memories are inherently slow with limited reliability and endurance which makes them unattractive for controllers requiring those attributes.

NAND flash memory is a block-based non-volatile memory with each block organized into and made of various pages. After a block is programmed, it is erased prior to programming it again. Most flash memory requires sequential programming of pages within a block. Another limitation of flash memory is that blocks can be erased for a limited number of times, thus frequent erase operations reduce the life time of the flash memory. Accordingly, flash memory does not allow for in-place updates. That is, it cannot simply overwrite existing data with new data. The new data are written to an erased area (out-of-place updates) only, and the old data are invalidated for reclamation in the future. This out-of-place update causes the coexistence of invalid (i.e. outdated) and valid data in the same block. "Garbage collection", as is well known to those in the art, is a process referred to in reclaiming the space occupied by invalid data and where valid data is moved to a new block and the old block is erased. Garbage collection generally and undesirably results in significant performance overhead as well as unpredictable operational latency.

As mentioned above, flash memory blocks can be erased for a limited number of times. Wear leveling is the process commonly employed to improve flash memory life time by evenly distributing erases over the entire flash memory (within a band). A typical Multi Level Cell_ (MLC) NAND flash manufactured using 25 nano meter technology typically has a program/erase (PE) cycle in the range of 1500 to 3000 cycles. They require erasing prior to being programmed with typical programming time or duration being approximately 10 milli seconds (ms) and a program time for programming a 4 to 8 Kilo Byte page being approximately 1 to 2 ms.

Moreover, NAND flash memories are organized in large page sizes of 8 KB and 16 KB and block sizes of 512 KB to 1 MB. Large page size attribute of flash memories makes it undesirable for small I/O operations since the whole page has to be programmed in its entirety. Programming a partial page requires merging of the existing data on the page with the new data and writing it to a new page. The old page will no longer contain valid data and has to be reclaimed eventually. Since the data corresponding to the same logical address is written to a different physical address, controller has to also maintain a table that maps the logical address to the physical address.

NAND flash memories, despite all their deficiencies, are nevertheless the preferred medium of choice for solid state mass storage devices because of their capacity to save large amounts of data at reasonable prices.

As such, to enhance user experience yet achieve cost effectiveness, its best to complement NAND flash memories with higher performance, reliability and endurance and perhaps more expensive types of media such as MRAM in the same mass storage device. This allows the controller to optimize its performance, reliability, and user experience by using the higher grade media to store its critical data and host system data and using the NAND flash memories to store host non-critical data.

The controller may divide the MRAM array of the mass storage device into a number of partitions and assign them to its private area or user area and utilize them accordingly.

What is needed is a storage device that takes advantage of the use of different types of memories, such as NAND and MRAM, and is reliable, efficient, yet cost-effective.

SUMMARY OF THE INVENTION

To overcome the limitations in the prior art described above, and to overcome other limitations that will become apparent upon reading and understanding the present specification, the present invention discloses a method and a corresponding structure for a magnetic storage memory device that is based on current-induced-magnetization-switching having reduced switching current in the magnetic memory.

Briefly, an embodiment of the invention includes a mass storage device with a controller that is configured to communicate with a host. The controller is coupled to a first memory and a second memory, the first and second memories being of different types. The mass storage device includes a storage media partitioned into a plurality of Logical Units (LUNs) based on capabilities and resources of the mass storage device. The mass storage device further includes the first memory and the second memories and a hybrid reserved area spanning at least a portion of the first and second memories.

These and other objects and advantages of the present invention will no doubt become apparent to those skilled in the art after having read the following detailed description of the preferred embodiments illustrated in the several figures of the drawing.

IN THE DRAWINGS

Figure 9:
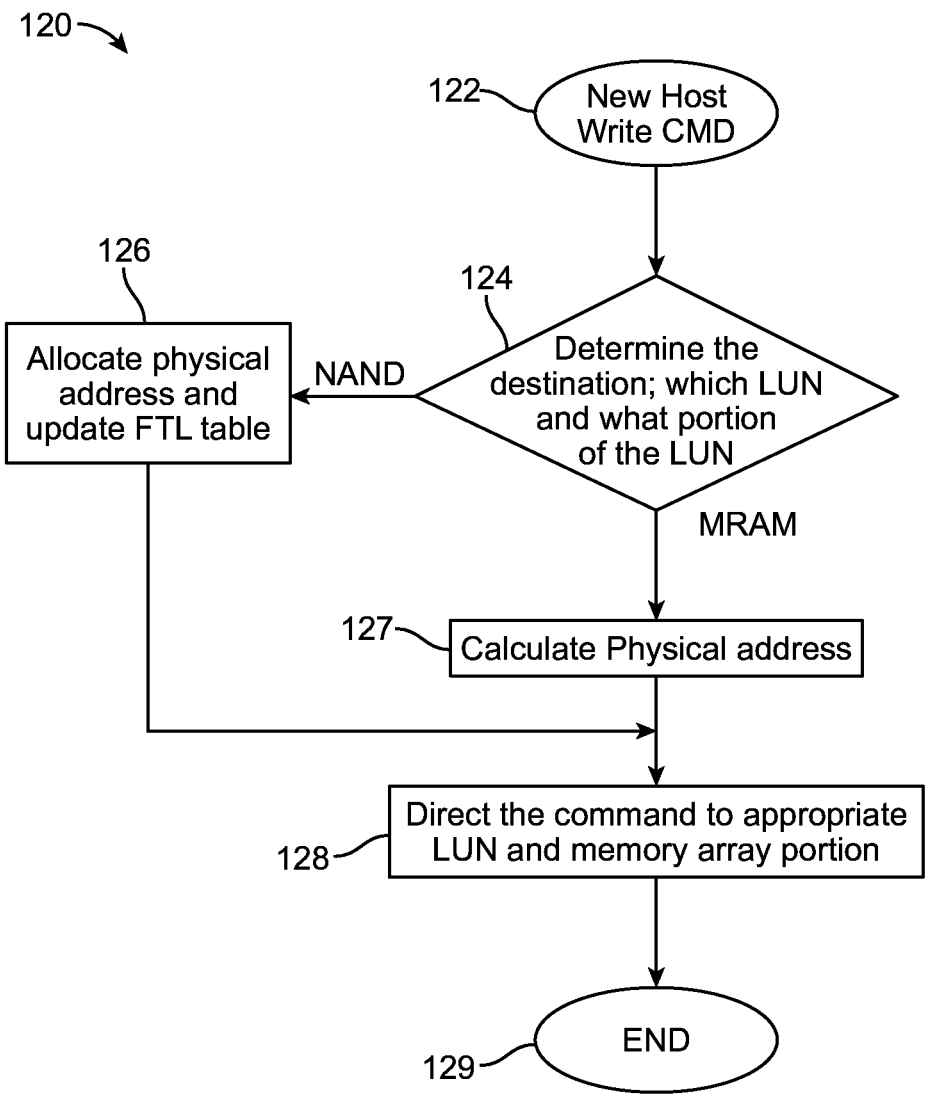
Figure 10:
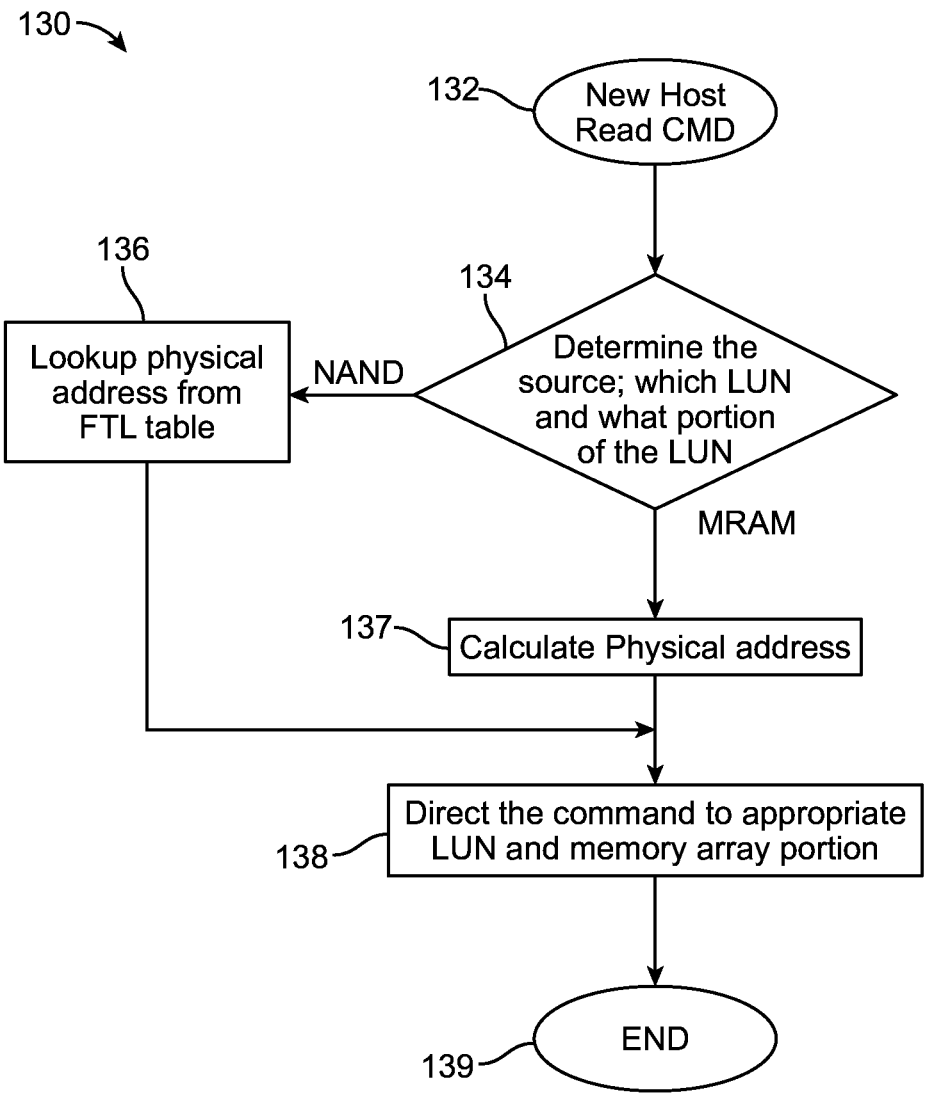

FIGS. 9 and 10 each show a flow chart of the relevant steps performed by the LUN manager 93 in processing commands from a host, in accordance with methods of the invention.

Figure 11:
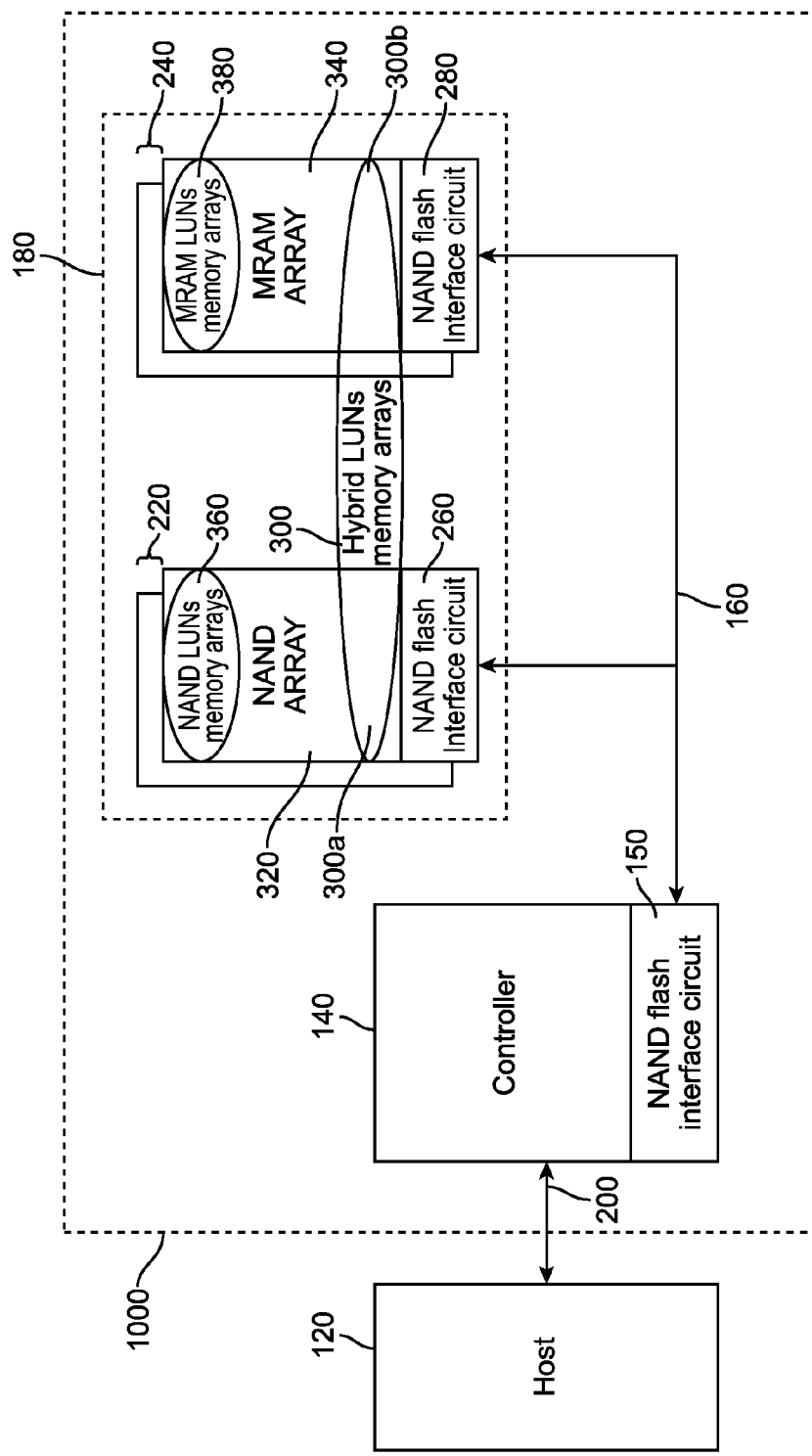

FIG. 11 shows a mass storage device 1000, in accordance with an embodiment of the invention.

Figure 12:
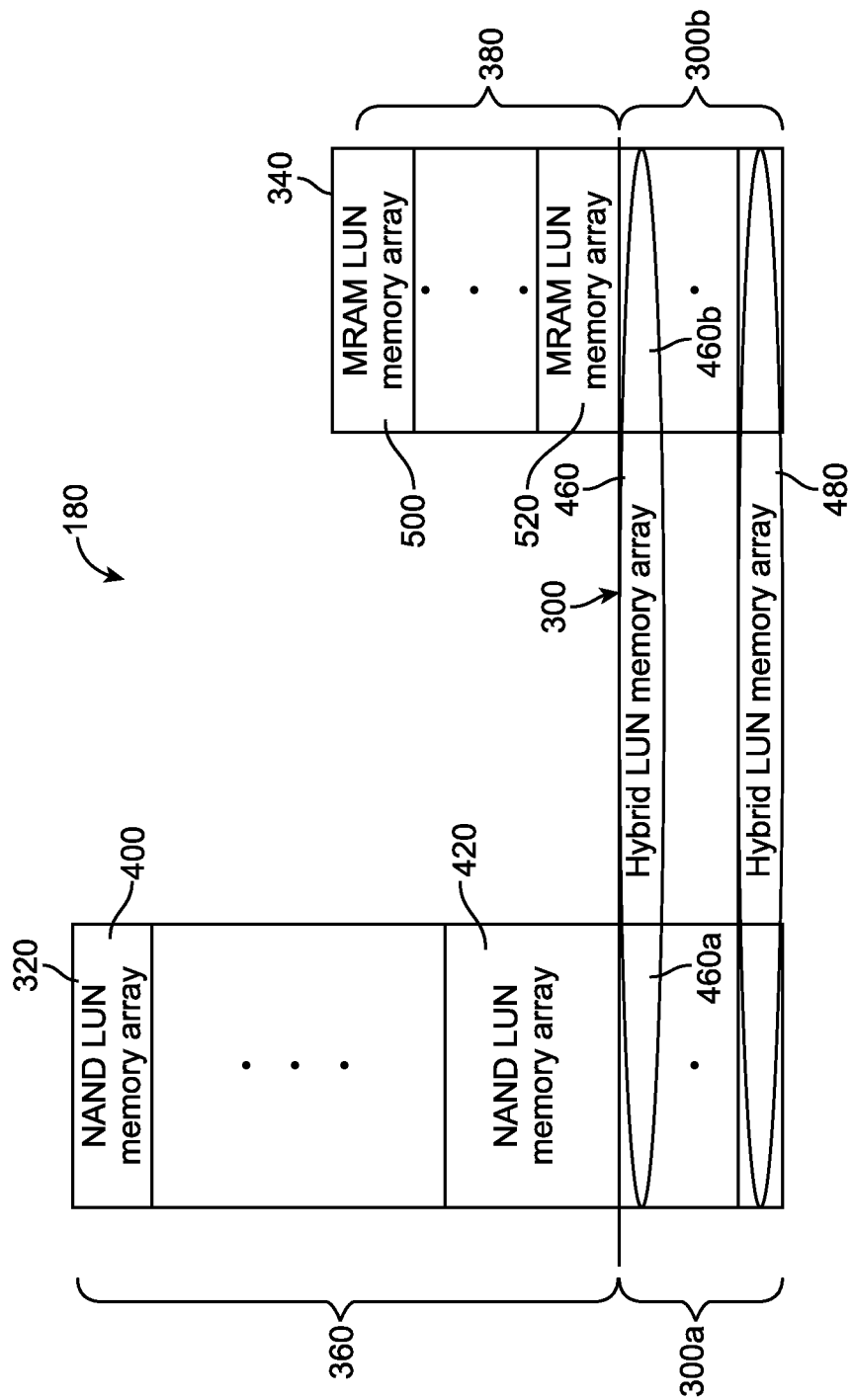

FIG. 12 shows further details of the NAND LUN 360, the MRAM LUN 380, and the hybrid LUN 300 of the storage media 180, in accordance with another embodiment of the invention.

Figure 13:
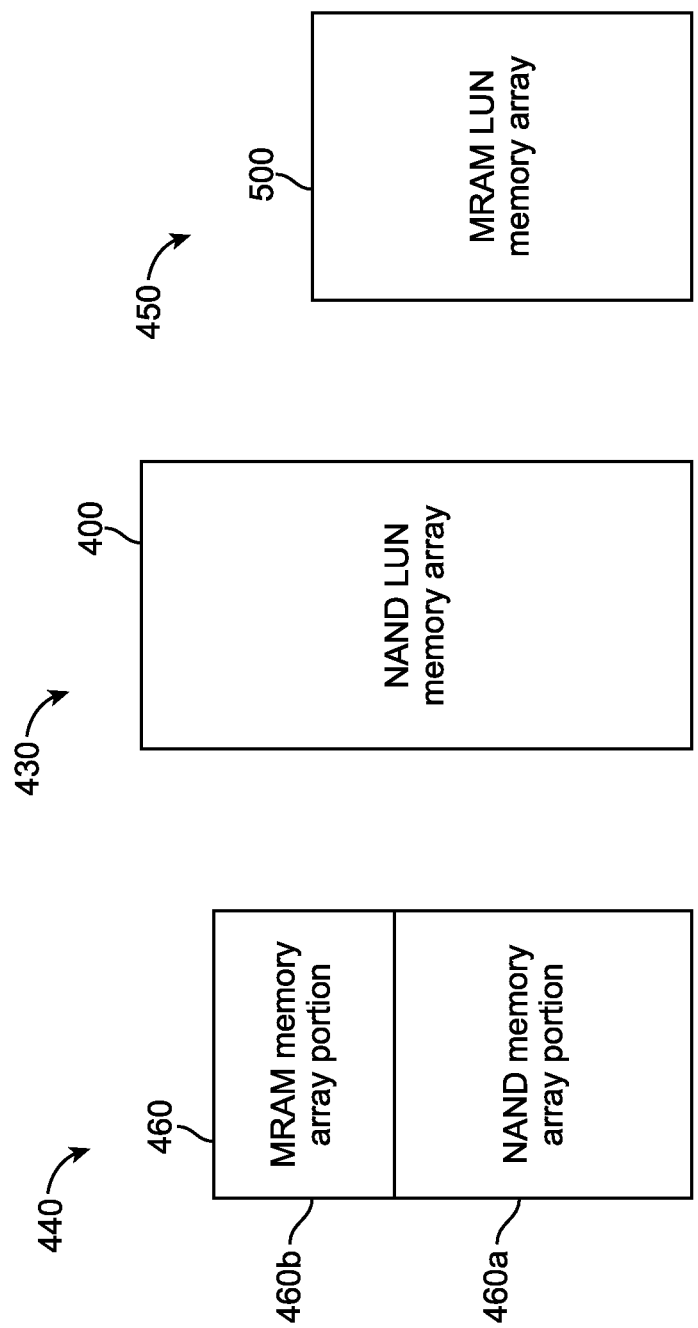

FIG. 13 shows an exemplary representation, using logical addresses, of LUNs 300, 360, and 38, each with distinct attributes.

Figure 14:
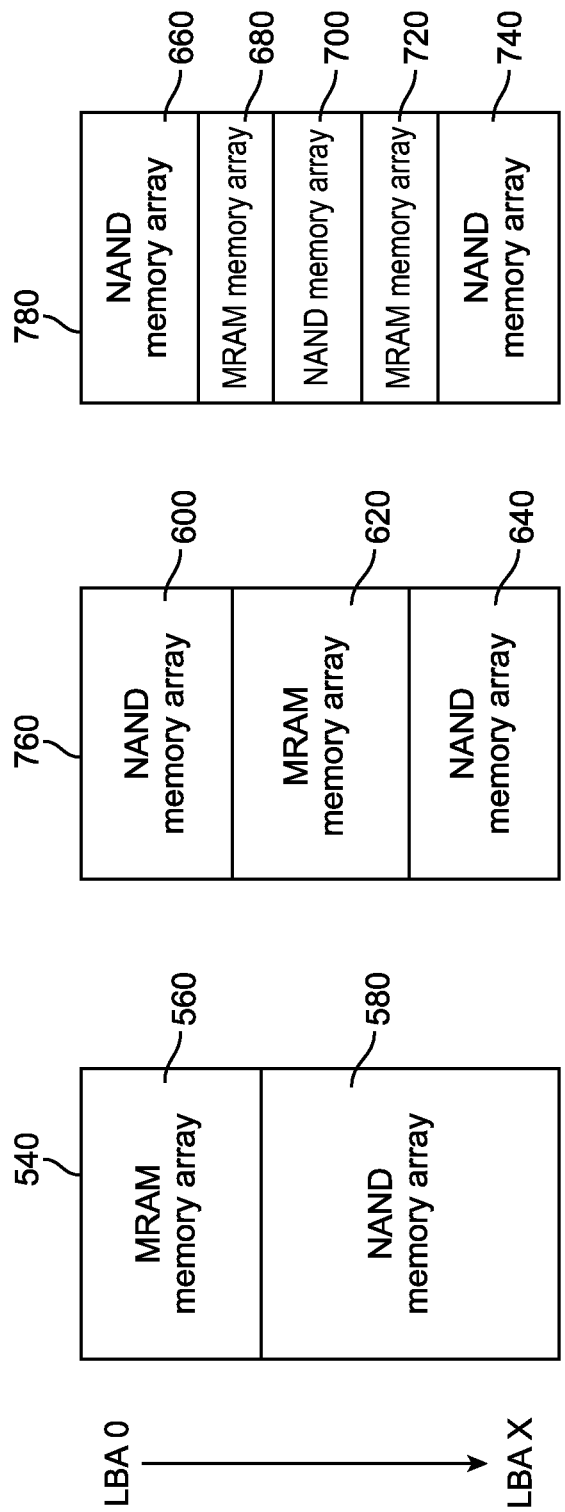

FIG. 14 shows exemplary hybrid LUNs, in accordance with an embodiment of the invention.

Figure 15:
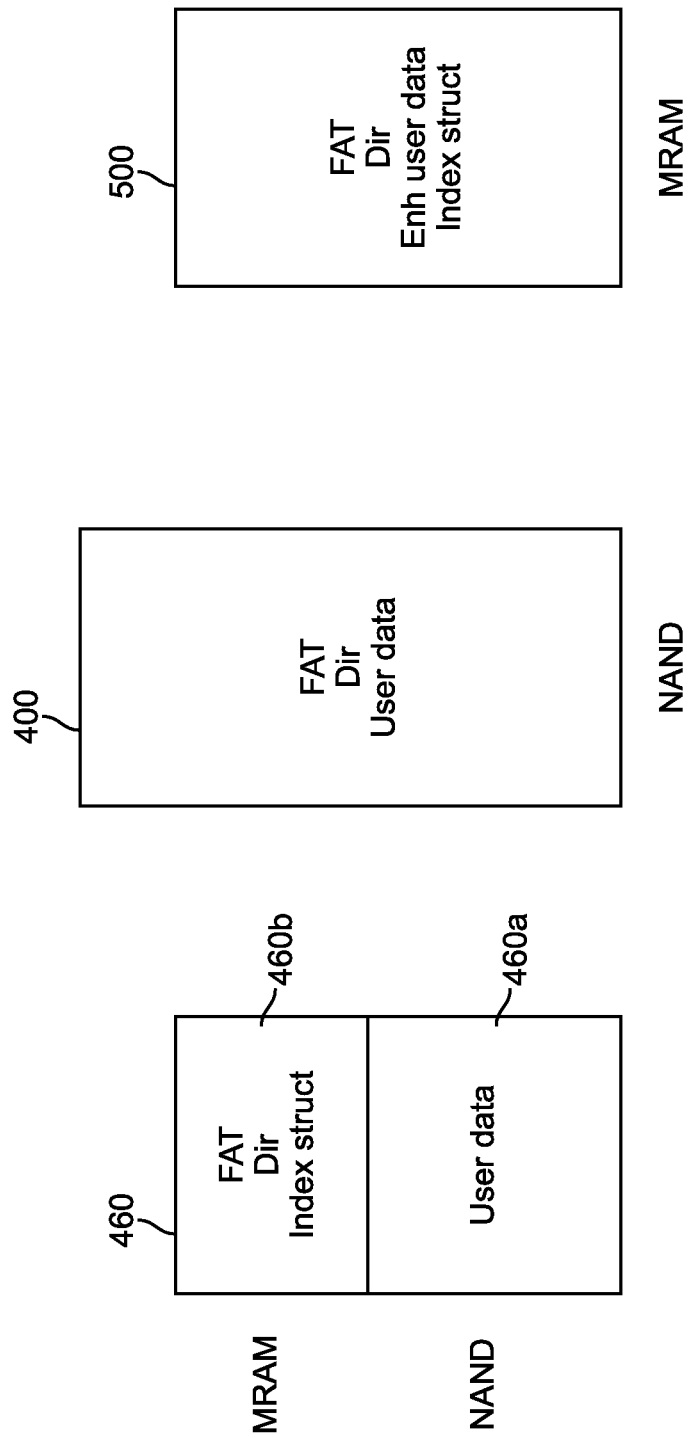

FIG. 15 shows exemplary types of data stored in each of the LUNs 300, 360 and 380, in accordance with an embodiment of the invention.

Figure 16:
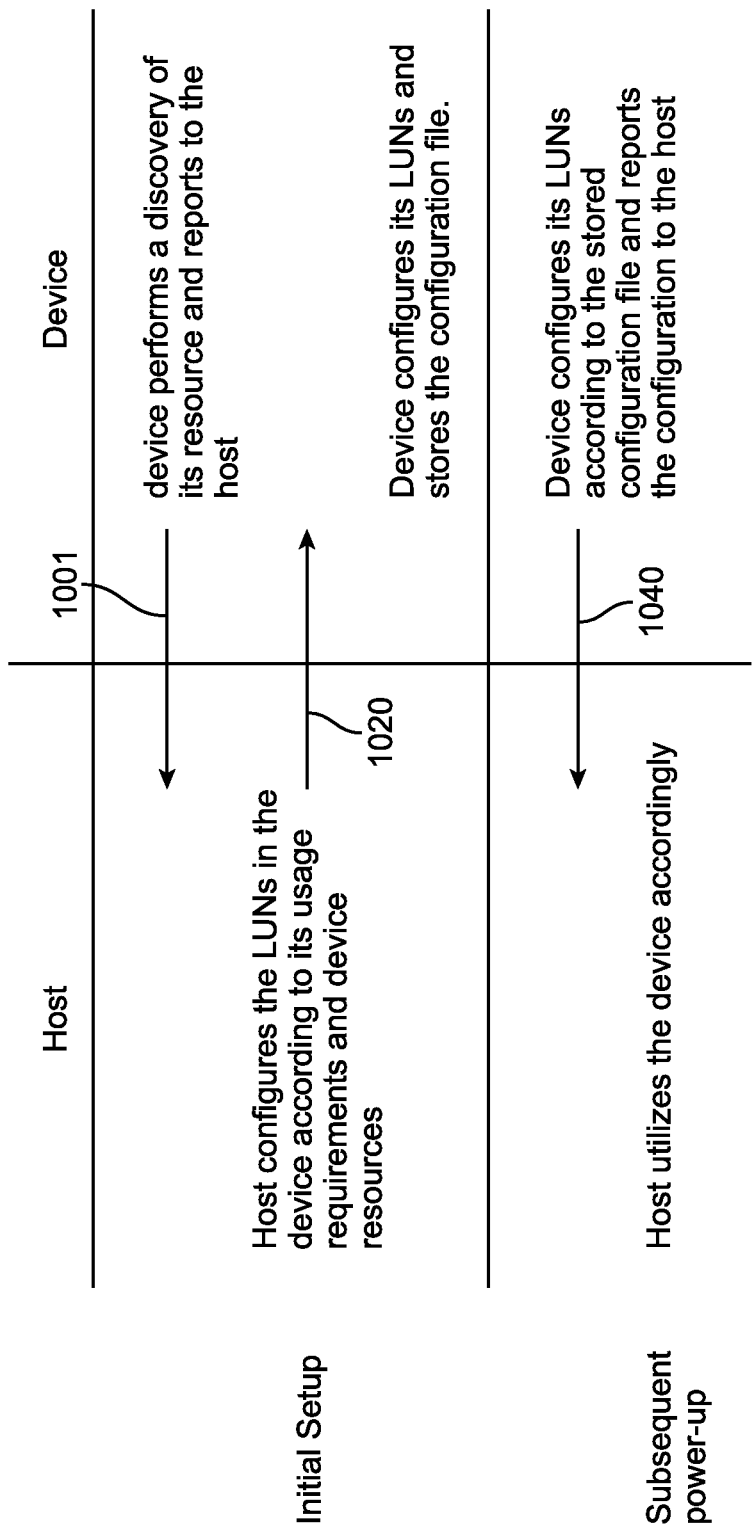

FIG. 16 shows the steps performed by the device 1000 of FIG. 11 during initialization by the host 12, in accordance with a method of the invention.

Figure 17:
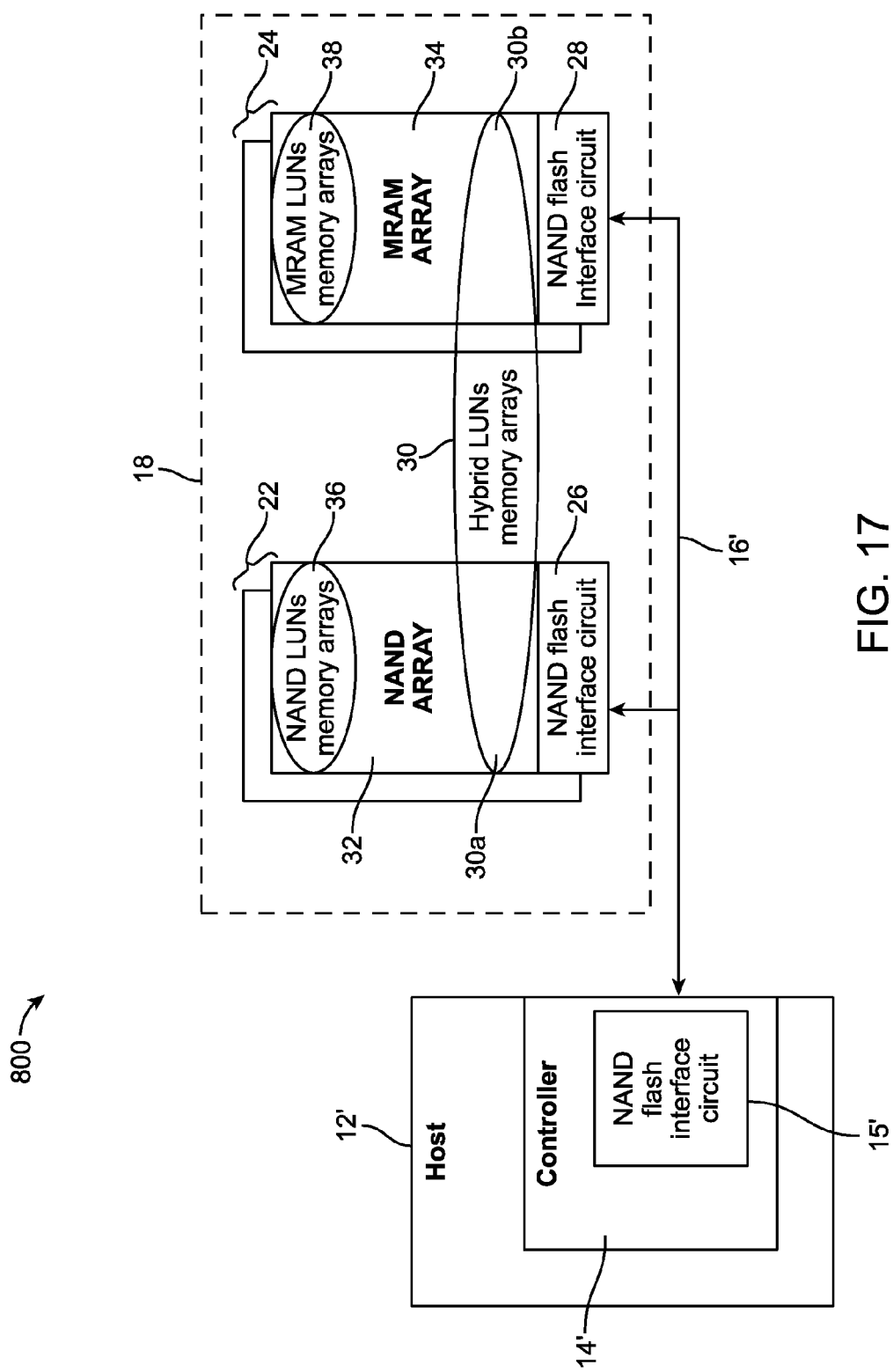

FIG. 17 shows a subsystem 800, in accordance with an embodiment of the invention.

Figure 18:
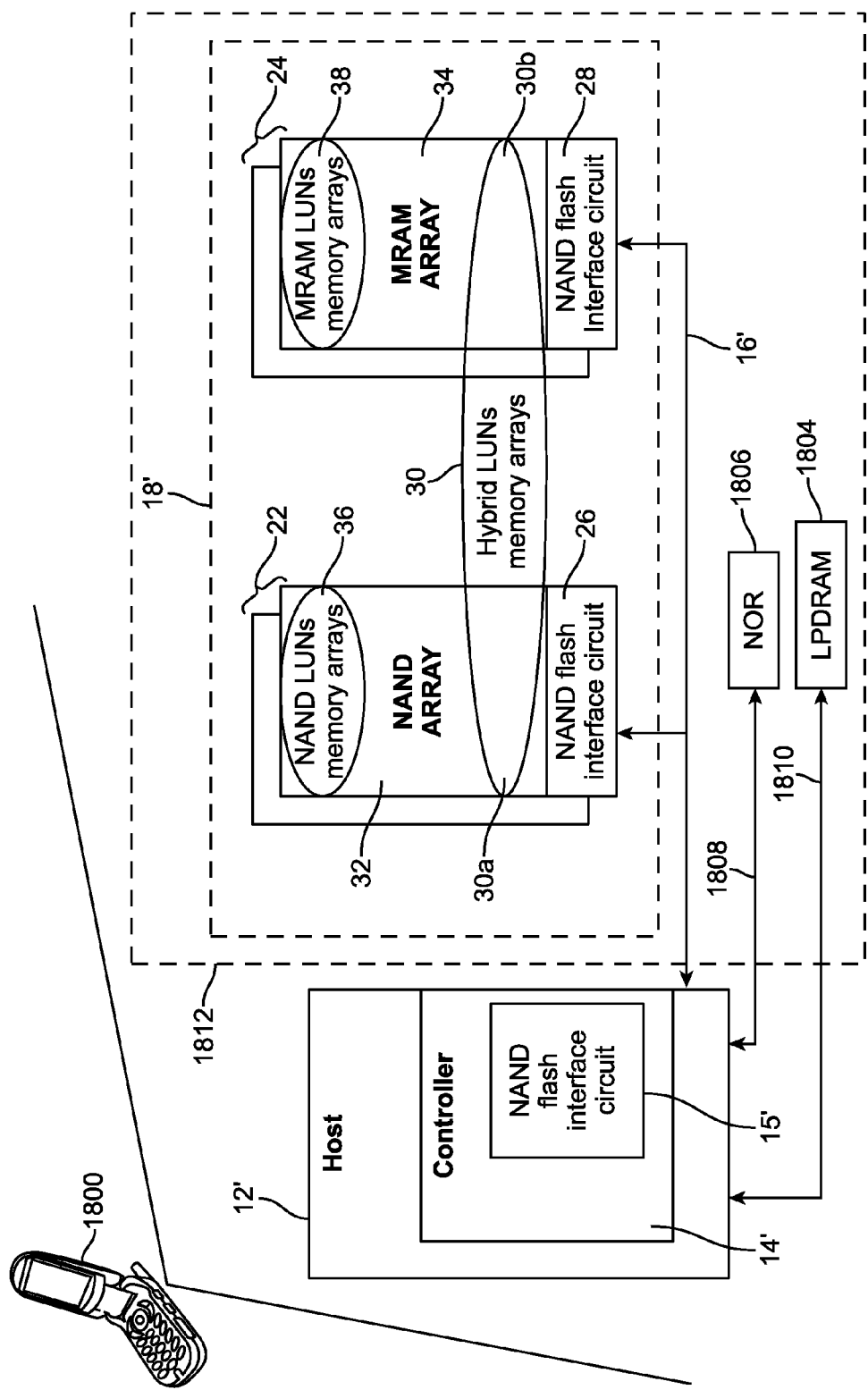

FIG. 18 shows an exemplary application of the various embodiments of the invention.

DETAILED DESCRIPTION OF THE VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention.

As will become evident, in some embodiments of the invention, MRAM and NAND Flash memories are combined in a mass storage device. Currently, MRAM devices are more costly than NAND flash memories and fail to provide the capacities that NAND flash memories offer but they are much faster than NAND flash with better reliability and endurance. As such, MRAM devices can be used by controllers to store their critical data requiring such attributes. NAND flash memories can provide large amount of storage at a lower cost and it can be used by controllers for storing user data from hosts which require large amount of capacity with lower performance, reliability and endurance. Examples of critical data are controller's boot code, tables and data cache and host's File allocation table, and directories and so on and examples of non-critical data are pictures, movies, videos, and so on.

MRAM devices are more expensive than NAND flash memories but they are much faster than NAND flash with better reliability and endurance and they can be used to store critical data requiring such attributes. NAND flash memories can provide large amounts of storage at a lower cost for storing user area which requires larger capacity with lower performance, reliability and endurance.

Figure 1:
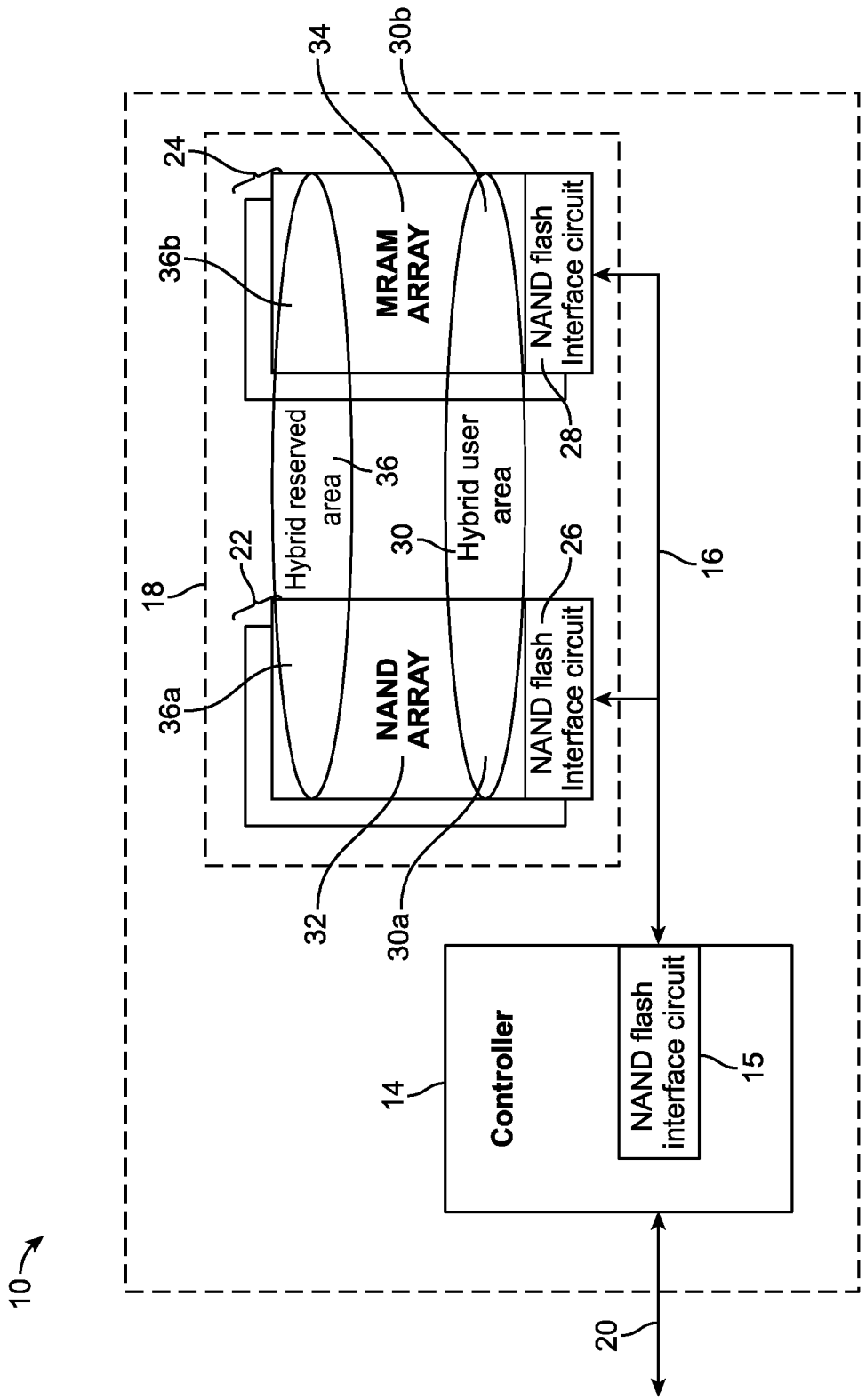
FIG. 1 shows a mass storage device 10, in accordance with an embodiment of the invention.

FIG. 1 shows a mass storage device 10, in accordance with an embodiment of the invention. The device 10 is shown to include a controller 14 with NAND flash interface circuit 15 and host interface 20, a flash interface 16, and a storage media 18. The controller 14 is shown coupled to the storage media 18 through the flash interface 16. The controller 14 is shown to include a NAND flash interface circuit 15.

The controller 14 can selectively utilize the different memories in the media for storing different type of data and that is used primarily by the controller 14 to manage the devices 22 and 24.

The storage media 18 is shown to include a number of NAND flash memory devices 22 and a number of magnetic random access memory (MRAM) devices 24. The storage media 18 includes hybrid reserved area 36 that is a combination of some portion of NAND array 32 and some portion of MRAM array 34. The storage media 18 also includes hybrid user area 30 that is a combination of some portion of NAND array 32 and some portion of MRAM array 34. The devices 22 is shown to include a NAND flash interface circuit 26 and NAND array 32. The NAND array 32 of storage media 18 includes the NAND portion 36a of hybrid reserved area 36 and the NAND portion 30a of hybrid user area 30. The devices 24 is shown to include a NAND flash interface circuit 28, MRAM array 34, and MRAM array 34 of storage medias 18 includes the MRAM portion 36b of hybrid reserved area 36 and the MRAM portion 30b of hybrid user area 30.

The hybrid reserved area 36 spans the MRAM devices 24 and the NAND flash memory devices 22 with the MRAM portion 36b being a portion of the MRAM devices 24 and the NAND portion 36a being a portion of the NAND flash memory devices 22. Similarly, the hybrid user area 30 spans the MRAM devices 24 and the NAND flash memory devices 22 with the MRAM portion 30b being a portion of the MRAM devices 24 and the NAND portion 30a being a portion of the NAND flash memory devices 22.

Alternatively, the hybrid reserved area 36 may be entirely a part of the MRAM portion 36b. Similarly, in alternative embodiments, the hybrid user area 30 is entirely a part of the MRAM portion 30b. In the case where both the hybrid reserved area 36 and the hybrid user area 30 are both entirely a part of the MRAM devices 24, there is no need for the NAND devices 22.

The hybrid reserved area 36 is used to store information that is private data or data that is inaccessible to a user of the device 10. Examples of private data include boot code, system data, Meta data, or tables.

Based on apriory information regarding the identity of a host that is to use the device 10, the controller 14 advantageously decides to store host-provided and host-critical data in the MRAM portion of the hybrid user area 30. An example of this is in the case of a file allocation table (FAT) file system, such as FAT16 or FAT 32, where the controller 14 stores the master boot record (MBR), partition boot record (PBR), FATs, and directories, all of which are frequently-accessed information and intended for lower logical block access (LBA) range of addresses, in the area 30b.

In the embodiment of FIG. 1, storage media 18 provides two types of memory devices with each having distinct and complementary attributes with MRAM devices 24 being very high performance and reliable and NAND flash memory devices 22 providing the majority of the capacity for the storage media 18. NAND flash memory devices may alternatively be replaced by other non-volatile devices such as resistive RAM (RRAM, ReRAM).

To simplify integration of MRAM and NAND flash into a single device, MRAM device requires an interface that is compatible with the NAND flash interface. Furthermore, most of the existing embedded mass storage controllers such as USB, MMC, and SD only support memories with NAND flash interface without any modification to the controller. Therefore, a MRAM device with NAND flash interface can be readily integrated with an existing controller and NAND flash memories to create a mass storage device with different media types to address different system requirements.

MRAM memories will make up the very high performance and reliable portion of the memory media of the storage device and can be used by the controller for storing data requiring such attributes. NAND flash memory portion of the memory media can be used by the controller for storing user area and data types that do not have such stringent requirements.

While MRAM is fast and reliable, it does not require erasure prior to being written with a new data. As such, management of data in the MRAM portion of the memory media can be greatly simplified. Controller will no longer have to perform garbage collections and mapping of that portion of the memory media which will further improve the performance of the system utilizing these storage devices.

It would also improve the performance of small IO operations since the data can be written over the existing data and thus eliminating the merge and eventual GC process.

Another advantage of having MRAM on the memory media is to store the metadata information. In most controller architecture such as SATA and mSATA, an external DRAM with either DDR2 or DDR3 interface is used to store the metadata information to improve the system performance. Due to the nature of MRAM, the controller can use the MRAM portion of the memory media to store metadata information and eliminate the controller cost associated with DDR interface as well as the external DRAM component.

Other controllers such as USB and MMC/eMMC that typically do not require the external DRAM use NAND flash for storing the metadata information. These controllers can also use the MRAM portion of the memory media and further improve system performance.

MRAM having an interface compatible with NAND flash memories becomes transparent to the controllers already having the NAND interface and with minor modifications to the firmware in the area of write, garbage collections, and metadata management due to the MRAM portion of the memory media, system performance will increase substantially.

The MRAM portion 36b can also be used by the controller 14 to cache host data or data provided by a host. Controller 14 can write the host data in response to host write command to the MRAM portion 36b and inform the host that the write command has completed. The controller 14 can then, at its convenience, find an available physical location within the hybrid user area 30 and move the host data from the MRAM portion 36b to the hybrid user area 30, which advantageously reduces the command completion latency substantially. In the event, there is no available physical location in the hybrid user area 30, the controller 14 performs 'garbage collection' to make available space for storing information in the NAND portion 30a prior to moving host data from the MRAM portion 36b into the hybrid user area 30. In the meanwhile, if the host wishes to read data that the controller 14 has saved in the hybrid reserved area 36 but not yet moved to the hybrid user area 30, the controller 14 knows to access this data only from the hybrid reserved area 36. Thus, host data coherency is maintained.

In another embodiment of this invention, the controller 14 may also use the MRAM portion 36b to collect enough host data to perform a NAND flash full page program operation. As is well known, in a NAND flash full page program operation, when host IO operations are smaller than a page program unit of the NAND flash memory, a controller has to either perform partial page programming, which involves merging of the old data with the new data and is time consuming or save the data in its volatile SRAM/DRAM buffer and wait for additional commands from the host until there is enough data to perform a page program operation. Meanwhile, the controller cannot send the command completion to the host since the host data has not yet written to a persistent media. The process of merging of the old data with the new data requires reading of the old data and appending the new data to the read old data and writing this, in its entirety, to another physical location within the NAND flash memory device, which is not only time consuming and effects performance of the device but it also increases the number of NAND flash program/erase operation and adversely effects NAND flash reliability and endurance. In the meanwhile, if the host wishes to read data that the controller 14 has saved in the reserved area MRAM portion 36b but not yet moved to the hybrid user area 30, the controller 14 knows to access this data only from the reserved area MRAM portion 36b. Thus, host data coherency is maintained. The foregoing problem is minimized in the various embodiments of the invention, by using the MRAM portion 36b for caching host data, which substantially improves command latency and system reliability particularly in systems with lots of small IO operations because of the persistent characteristic of MRAMs.

In some embodiments of the invention, as discussed and shown herein, MRAM memories are mapped into controller's reserved area and provide very high performance and reliable media for controller's critical parameters requiring such characteristics. NAND flash memories can also be mapped into user area and be used for user data and data types that do not such stringent requirements. A combination of MRAM and NAND flash memories can also be mapped into a hybrid user area and hybrid reserved area and be used for systems that only require high reliability and performance for some of the data being stored on it. Controller will use the media type for storing its parameters and host data, based on their attributes.

Figure 2:
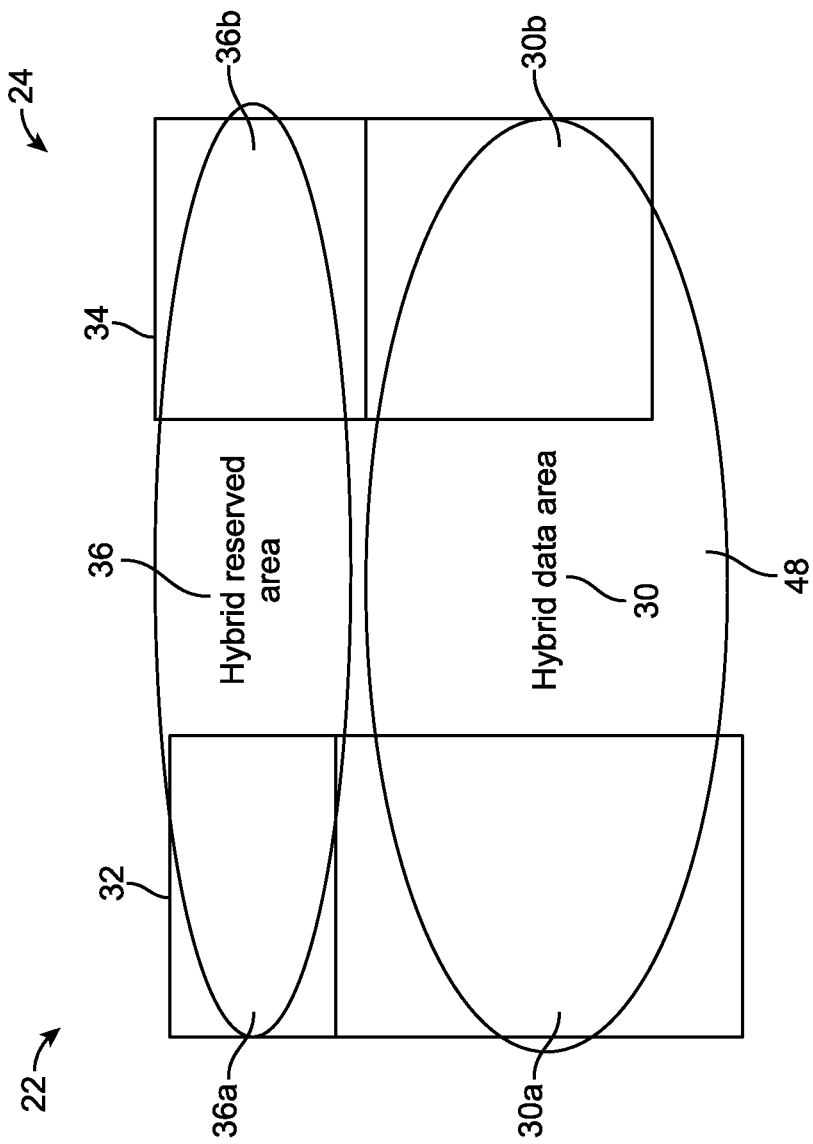
FIG. 2 shows further details of the hybrid reserved area 36 and hybrid user area 30, in accordance with another embodiment of the invention.

FIG. 2 shows further details of the physical representation of the NAND array 32 of NAND flash memory devices 22 and the MRAM array 34 of MRAM devices 24. The NAND array 32 of storage media 18 includes the NAND portion 36a of hybrid reserved area 36 and the NAND portion 30a of hybrid user area 30. The MRAM array 34 of storage media 18 is shown made of the NAND portion 36b of hybrid reserved area 36 and the MRAM portion 30b of hybrid user area 30 in accordance with another embodiment of the invention. The hybrid reserved area 36 and the hybrid user area 30 may be constructed of different combination of the MRAM portion 36b and 30b respectively and the NAND portion 36a and 30a.

Figure 3:
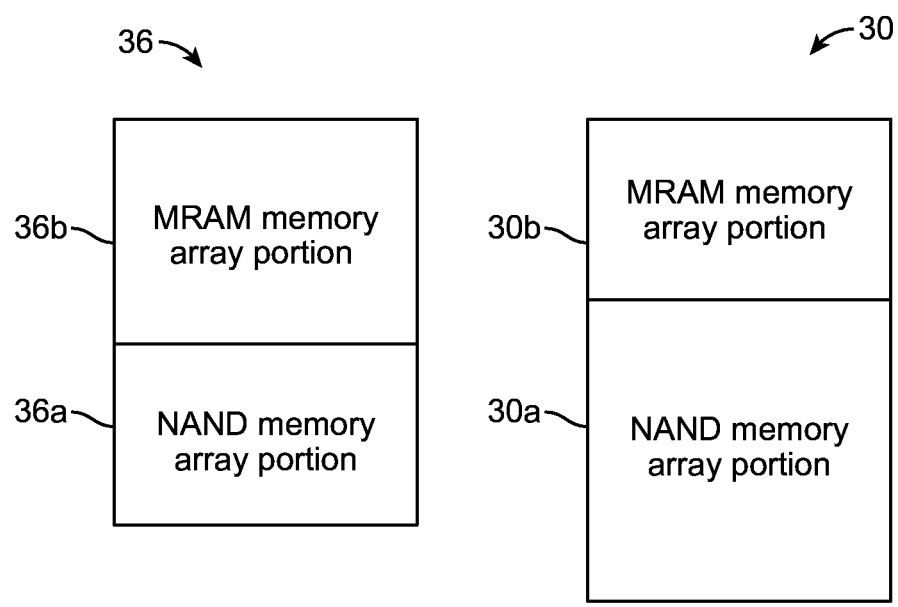
FIG. 3 shows an exemplary logical representation of hybrid reserved area 36 and hybrid user area 30, in accordance with an embodiment of the invention.

FIG. 3 shows an exemplary logical representation of memory arrays of hybrid reserved area 36 and hybrid user area 30 FIG. 2. The hybrid reserved area 36 is made of mixed memory array; the MRAM portion 36b and the NAND portion 36a and provides a mixed attribute reserved area to the controller 14 for storing its data. The hybrid user area 30 is made of mixed memory array; the MRAM portion 30b and the NAND portion 30a and provides a mixed attribute user area to the controller 14 for storing host data.

Figure 4:
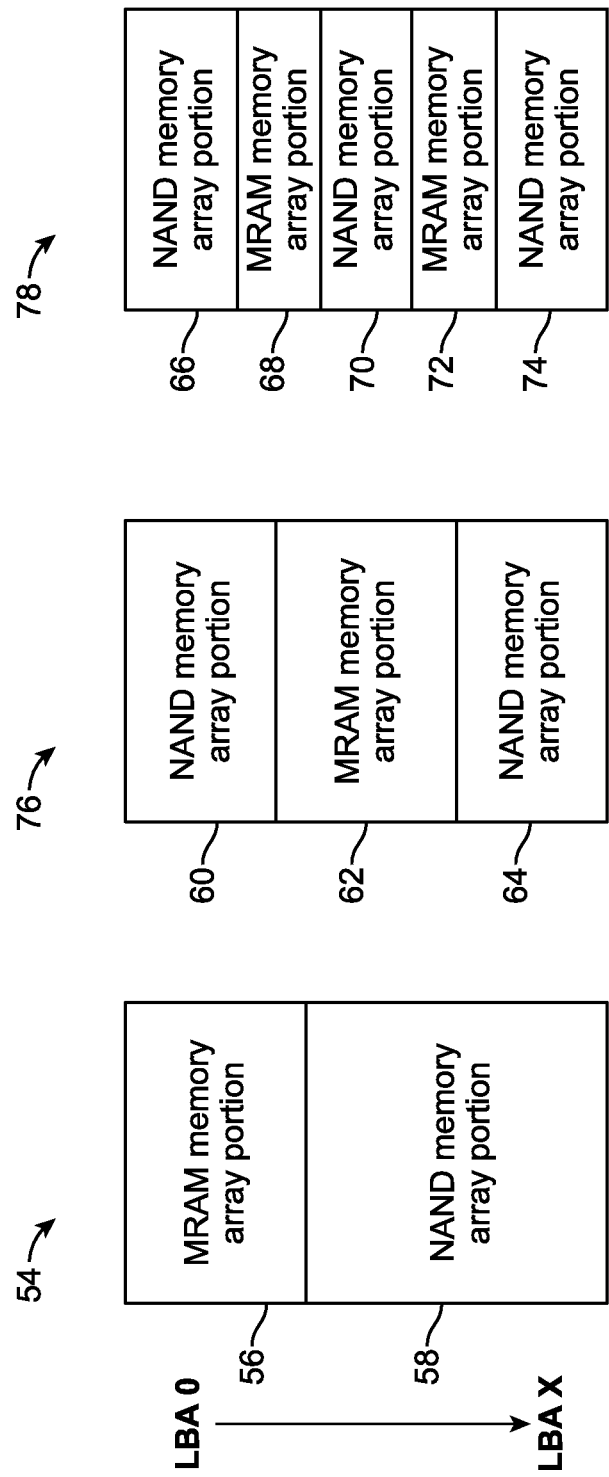
FIG. 4 shows exemplary logical representation of hybrid user area 30, in accordance with an embodiment of the invention.

FIG. 4 shows exemplary logical representation of different type of memory arrays of hybrid user area, in accordance with an embodiment of the invention. Each of the hybrid user area 54, 76, and 78 may be the hybrid user area 30 of FIG. 1. In FIG. 4, the hybrid user area 54 is shown to include the MRAM memory array portion 56 on the lower logical block addresses (LBAs) and the NAND memory array portion 58 at the higher LBAs. The hybrid user area 76 is shown to include the MRAM memory array portion 62 in the middle of the LBA range and two NAND memory array portions 60 and 64 at the lower and the higher LBA range in accordance with another embodiment of the invention. The hybrid user area 78 is shown to include two MRAM memory array portions 68 and 72 at two different LBA ranges and three NAND memory array portions 66, 70 and 74 at the lower, middle and upper LBA range. These exemplary logical representations of different memory arrays of a hybrid user area are to demonstrate that the user area may of any size and combination of MRAM and NAND memory arrays. Furthermore, MRAM memory array portion and NAND memory array portion of hybrid user area may be any size and occupy various portion of the hybrid user area logical address space range.

Figure 5:
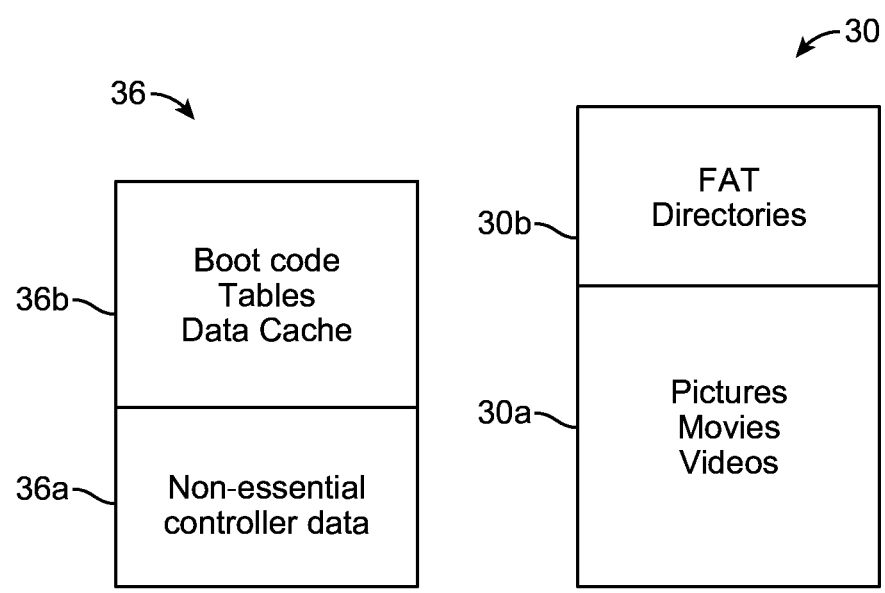
FIG. 5 shows exemplary types of data stored in each of the hybrid user area 30 and hybrid reserved area 36, in accordance with an embodiment of the invention.

FIG. 5 shows exemplary types of data stored by the controller 14 in memory arrays of each of the hybrid reserved area 36 and hybrid user area 30, in accordance with an embodiment of the invention. The MRAM portion 36b of hybrid reserved area 36 is shown, as an exemplary embodiment, to include the boot code, tables and data cache which are frequently accessed by the controller and effect system performance and the NAND portion 36a of the hybrid reserved area 36 is shown for example to include non-essential controller data. The MRAM portion 30b of hybrid user area 30 is shown for example to include FAT and directories which are frequently accessed by the host and effect system performance and the NAND portion 30a of the hybrid user area 30 is shown for example to include data from host such as pictures, movie, and videos.

Figure 6:
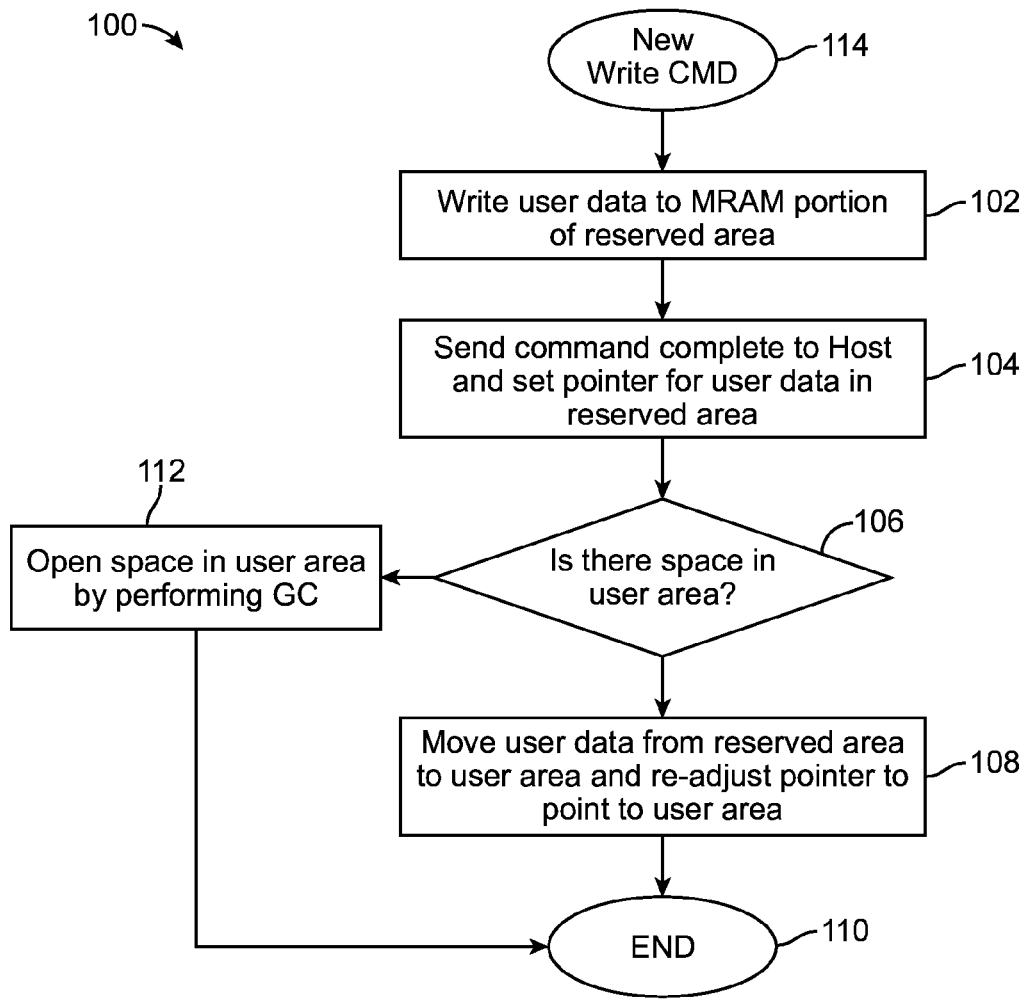
FIG. 6 shows a flow chart of the steps performed by the mass storage device 10, in accordance with a method of the invention.

FIG. 6 shows a flow chart 100 of the steps performed by the mass storage device 10, in accordance with a method of the invention. The steps of FIG. 6 are generally performed by the controller 14 (FIG. 1). At step 114, a write command to a LUN, typically provided by the host, is received by the controller 14 followed by the user data. At step 102, the user data received by the controller 14 is written to the MRAM portion of the reserved area of the device 24, or MRAM portion 36b. Next, at step 104, a command is sent by the controller 14 to the host through the host interface 20 indicating completion of the writing in step 102 and a pointer is set identifying the location of the user data being in MRAM portion 36b.

Next, at 106, a determination is made by the controller 14 as to whether or not available space remains in the LUN that the user data was intended for. If not, the process continues to step 112 where space in the intended LUN is freed up by the controller 14 by performing garbage collection, and if so, the process moves onto the step 108.

At step 108, user data is moved from the MRAM portion 36b to the intended LUN and the pointer of step 104 is re-adjusted to point to the location in the LUN where the user data has been moved, and the process ends at 110.

Figure 7:
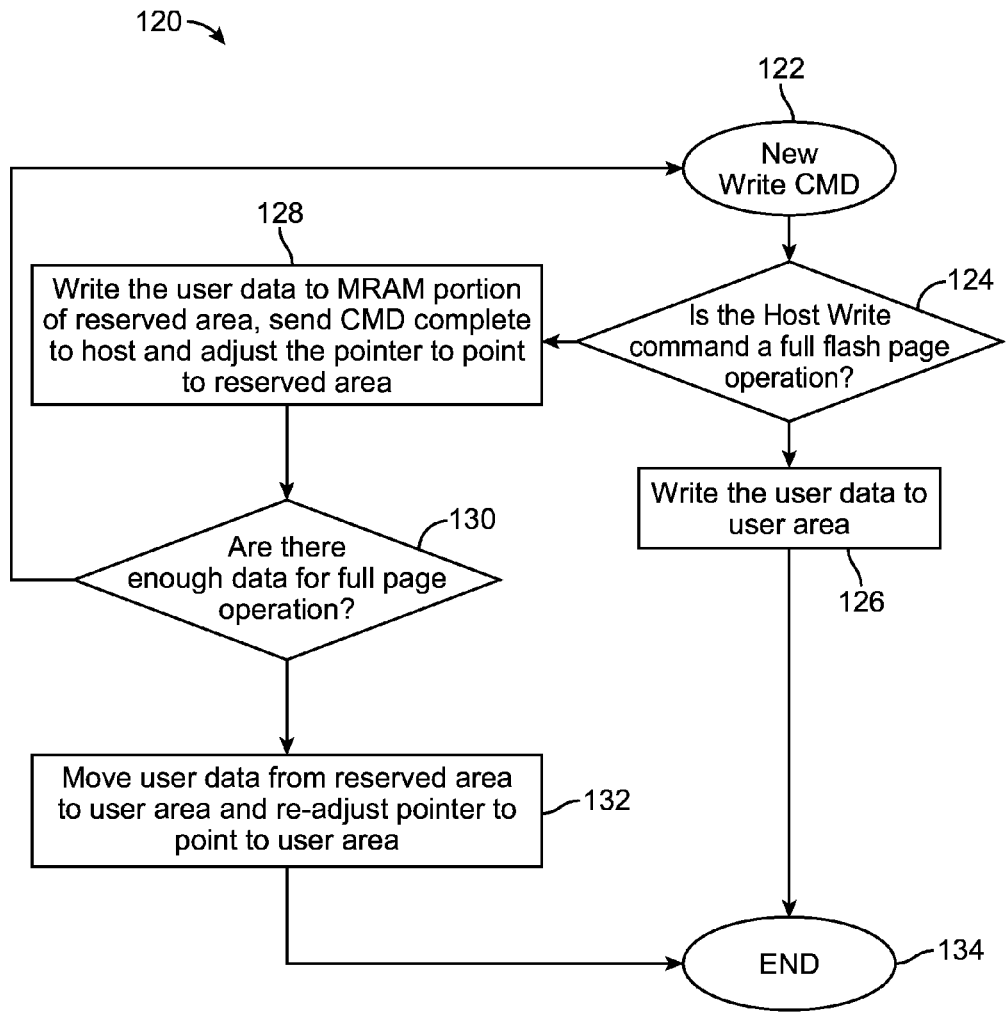
FIG. 7 shows a flow chart of the steps performed by the mass storage device 10, in accordance with a method of the invention.

FIG. 7 shows a flow chart 120 of the steps performed by the mass storage device 10, in accordance with a method of the invention. At step 122, a new write command to a LUN is received from a host by the controller 14 followed by user data. Next, a determination is made at 124 as to whether or not the host write command, received by the controller 14 at step 122, is a write to a full-flash page, i.e. full-flash page operation. If so, the user data is written to the intended LUN and the process ends at step 134.

If the host write command is not a full-flash page, the process continues to step 128 where user data is written to the reserved area MRAM portion 36b and a command complete is sent to a host, by the controller 14, such as done at step 102 of FIG. 6 and a pointer is set identifying the location of the user data being in MRAM portion 36b.

Next, at 130, a determination is made as to whether or not enough data is been collected in the reserved area MRAM portion for a full-page operation. If so, user data is moved from the MRAM portion 36b to the intended LUN and the pointer of step 128 is re-adjusted to point to a location in the LUN where the user data has been moved, and the process ends at 134. If there is not enough data for a full-page operation, the controller waits for the next write command from the host at step 122.

Figure 8:
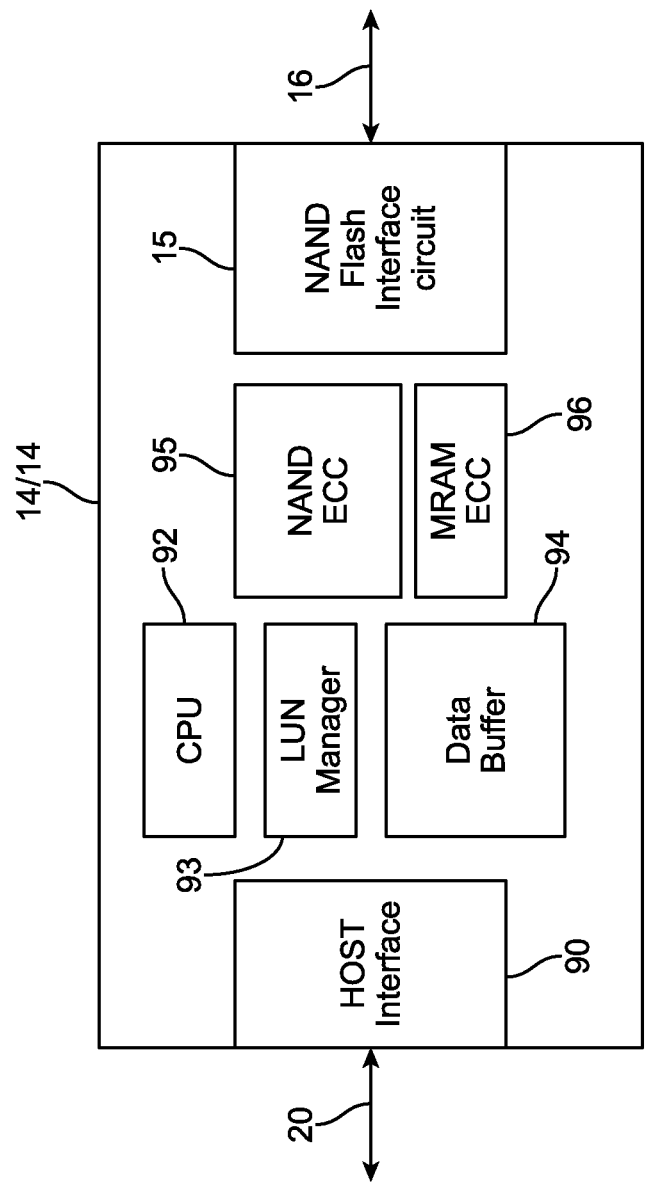
FIG. 8 shows a high level block diagram of further details of the controllers 14 or 14', in accordance with an embodiment of the invention.

FIG. 8 shows a block diagram of the controller 14 (shown in FIG. 1), in accordance with an embodiment of the invention. The controller 14 is shown to include a host interface block 90, a CPU 92, a LUN manager 93, a data buffer 94, a NAND error correcting code (ECC) 95, a MRAM ECC 96, and a NAND flash interface circuit 15. The structures shown in FIG. 8 as a part of the controller 14 are generally controlled by the CPU 92. Thus, the CPU 92 is coupled to these structures. The host interface block 90 is coupled to the LUN manager 93 and to the data buffer 94. The LUN manager 93 is coupled to the data buffer 94. The LUN manager 93 is further coupled to the NAND ECC 95 and the MRAM ECC 96, which in addition to being coupled to the CPU 92, is coupled to the circuit 15. Similarly, the MRAM ECC 96, in addition to being coupled to the CPU 92, is coupled to the circuit 15.

It is understood that the NAND ECC and the circuit 15 may of other types of memory known in the art. For example, the NAND ECC may be a dynamic random access memory (DRAM) ECC or a resistive random access memory (RRAM) ECC and the circuit 15 may be a DDR2 or DDR3 or a DRAM interface. To this end, the NAND array 32 and the circuit 26 may be other types of memory and interface, respectively. For example, the NAND array 32 may be DRAM, SRAM, or any other types of non-volatile memory, such as RRAM, except for MRAM, and the circuit 26 may be a DRAM or SRAM interface or a DDR2 or DDR3 interface. The type of interface in the circuit 15 is obviously dictated by the type of memory the NAND array 32 is.

Command and data is received through the host interface 90 during write operations. During read operations, command is received in a similar manner and data is received through the interface circuit 15. CPU 92 processes the command received from host and configures the controller to either receive data from host into data buffer 94 or receive data from the storage media into data buffer 94. The LUN manager 93 determines the source or destination of data based on LUN configuration information set by the host and the controller. Depending on the destination of the data, during a write operation, either the NAND ECC 95 or the MRAM ECC 96 encode the data that is to be saved in memory and the interface circuit 15 couples the encoded data onto the flash interface 16. During a read operation, data is received by the interface circuit 15, through the interface 16 and it is decoded by either the NAND ECC 95 or the MRAM ECC 96 depending on the source of the data, and then placed in the data buffer 94 and provided to the host interface 90 for coupling onto the host interface 20.

In some embodiment, MRAM array 34 may not require the protection provided by the MRAM ECC engine 96 or the MRAM device includes the required protection and does not need an external circuitry. In yet another embodiment, MRAM ECC 94 and NAND ECC 95 may be combined into a single ECC engine and be configured according the memory array the data is intended for.

In operation, the host interface block 90 receives commands and data through the host interface 20 and provides the same to the LUN manager 93, under the control of the CPU 92. The LUN manager 93 processes the received information, which is further explained in the subsequent figures and discussion to follow. Upon processing the received information, the LUN manager 93 transmits the data to the data buffer for storage. Depending upon the intended destination of the data, as determined by the LUN manager 93, the data is either transmitted to the NAND ECC 95 or to the MRAM ECC 96. For example, if the LUN manager 93 decides that the data is suited for storage in the MRAM array 34 (shown in FIG. 1), the data is transmitted to the MRAM ECC 95, otherwise, the data is transmitted to the NAND ECC 95.

Each of the ECCs 95 and 96 code the data using a syndrome, well known in the industry, except that the MRAM ECC 96 typically has a smaller syndrome and therefore results in a shorter overhead than the NAND ECC 95, which typically has a larger syndrome and overhead. In fact, a part of the appeal in using two separate ECCs for the NAND and MRAM data is to benefit from a shorter overhead associated with data intended for the MRAM array. Stated differently, if the NAND ECC 95 and the MRAM ECC 96 were combined into a single ECC, which is feasible and contemplated, the ECC syndrome would have to be large enough to accommodate the NAND ECC even though the MRAM ECC 96 needs an ECC syndrome that is a fraction of that of the NAND ECC. This results in wasted space in the MRAM array 34 since ECC bits are appended to the data when stored in the array.

FIGS. 9 and 10 each show a flow chart of the relevant steps performed by the LUN manager 93 in processing commands from a host, in accordance with methods of the invention. FIG. 9 shows the flow chart 120 for processing a write command from the host. At step 122, a new write command is received through from a host through the host interface 20. Next, at 124, the destination LUN is determined and whether or not the destination of the data to be written is the MRAM portion of the LUN or NAND portion of the LUN. If it is determined that the data is intended to be stored in the MRAM, the process continues to the step 127 where physical address is calculated, otherwise, the process goes to the step 126. After calculation of the physical address at step 127, the received command from the host is directed to an appropriate LUN and memory array portion at step 128 and the process ends at 129. At step 126, physical address is allocated and the flash translation layer (FTL) table is updated, which is required when flash memory, such as NAND is employed.

FIG. 10 shows the flow chart 120 for processing a read command from the host. At step 123, a new read command is received through from the host through the host interface 20. Next, at 134, the source LUN is determined and whether or not the source of the data to be read is from the MRAM portion of the LUN or NAND portion of the LUN. If it is determined that the data is to be read from the MRAM, the process continues to the step 137 where physical address is calculated, otherwise, the process goes to the step 136. After calculation of the physical address at step 137, the received command from the host is directed to an appropriate LUN and memory array portion at step 138 and the process ends at 139. At step 136, the physical address is looked up from the FTL table, which is required when flash memory, such as NAND is employed.

To enhance user experience yet achieve cost effectiveness, as is evident using the various embodiments of the invention, NAND flash memories are complemented by using higher performance, reliability and endurance and perhaps more expensive types of media, such as MRAM in the same mass storage device. This allows the host to optimize its performance, reliability, and user experience by using the higher grade media to store its critical data and using the NAND flash memories to store non-critical data.

The host software may partition the mass storage device into a number of LUNs based on device capabilities and resources, where each LUN is mapped to a type of media or combination of different type of media according to that particular LUN utilization.

MRAM and NAND flash memories are combined in a mass storage device to improve a storage device's performance and reliability, among perhaps further benefits. Currently, MRAM devices are more costly than NAND flash memories and fail to provide the capacities that NAND flash memories offer but they are much faster than NAND flash with better reliability and endurance. In the various embodiments that follow, MRAM devices are used by a host to store critical data requiring certain attributes. In combination therewith, NAND flash memories are employed in conjunction with the MRAM devices to allow large amount of storage at a lower cost. NAND flash memory is used by the host for storing non-critical user data, which require large capacity with lower performance, reliability and endurance. Examples of critical data, as previously indicated, are OS, database indexing, and on the like. Examples of non-critical data, as previously indicated, include pictures, movies, videos, and on the like.

To simplify integration of MRAM and NAND flash memories into a single device, a MRAM device is disclosed to have an interface compatible with an interface of its counterpart NAND flash device. Furthermore, most of the existing mass storage controllers such as multi-media card (MMC) and universal serial bus (USB) which only support memories with NAND flash interface can use the MRAM devices without any modification to the controllers. In some embodiments, a MRAM device is disclosed to include a NAND flash interface integrated with a known controller and NAND flash memories defining a mass storage device with advantageously different media types to address different system requirements.

In some embodiments of the invention, as will be evident shortly, MRAM memories are mapped into one or more partitions or Logical Unit Numbers (LUNs), and referred to herein as "MRAM LUNs", and provide very high performance and reliable media for data types requiring characteristics described hereinabove.

In some embodiments, NAND flash memories are mapped into one or more partitions or LUNs ("NAND LUNs") and used for storing user data and data types that do not need such stringent requirements. In some embodiments, a combination of MRAM and NAND flash memories are mapped into a LUN ("hybrid LUNs") that only requires high reliability and performance for some of the data being stored therein. A host using such a configuration advantageously utilizes the LUNs based on their attributes.

In some embodiments, LUNs may be pre-configured by the storage device manufacturer and the host merely uses the LUNs based on some prior knowledge. In a more versatile configuration, the storage device reports its storage resources and capabilities such as the capacity of NAND flash memories and MRAM to the host and the host then configures the LUNs according to its requirements.

Referring now to FIG. 11, a mass storage device 1000 is shown, in accordance with an embodiment of the invention, to include a host 12, a controller 140, a flash interface 160, and a storage media 180. The controller 140 is shown to include a NAND flash interface circuit 150, the storage media 180 is shown to include a number of NAND flash memory devices 220 and a number of magnetic random access memory (MRAM) devices 240. The devices 220 are shown to include a NAND flash interface circuit 260 and the devices 240 are shown to include the NAND flash interface circuit 280. Further, some of the NAND array 320 defines an area therein that is referred to herein as "NAND LUNs memory arrays 36" and some of the MRAM array 340 defines an area therein that is referred to as "MRAM LUNs memory arrays" 380. A hybrid LUNs memory arrays 300 is shown to span across the devices 220 and 240.

The devices 220 include NAND array 320 and the devices 240 include MRAM array 340. Further, the devices 220 includes NAND LUNs memory arrays 360 and the devices 240 includes MRAM LUNs memory arrays 380.

The host 12 is shown coupled to the controller 140 through a host interface 200 and the controller 140 is shown coupled to the storage media 180 through the flash interface 16. In this manner, the host 12 sends commands, critical and non-critical data, among other types of information to the controller 140, through the host interface 200. Similarly, the controller 140 accesses the devices 220 and 240 through the flash interface 160. Each of the interfaces 200 and 160 are made of interfaces readily known to those in the art.

The hybrid LUNs memory array 300 is made of a combination of a portion of NAND array 320 and a portion of MRAM array 340. The portion of the NAND array 320 of the hybrid LUNs memory arrays 300 is referred to herein as the "hybrid LUNs NAND portion" 300a and the portion of the MRAM array 340 of the hybrid LUNs memory arrays 300 is referred to herein as the "hybrid LUNs MRAM portion" 300b.

In some embodiment, not shown in FIG. 11, a "LUN" includes at least a part of the controller 140.

It is understood that the interface circuits 150, 260, and 280 may be other than NAND flash, examples of which include but are not limited to DDR2, DDR3, DDR4, SPI, or any other industry standard or proprietary interface. It is also understood that the NAND array 320 and the memory array 360 may be other than NAND and can be any type of non-volatile memory, examples of which include but are not limited to RRAM, PCM or any other Non-volatile memory that posses substantially different characteristics to MRAM. It is further understood that the MRAM array 340 and the memory arrays 380 may be any type of non-volatile memory, such as but not limited to resistive random access memory, phase change memory that posses substantially different characteristics to NAND.

In operation, the host 12 sends and receives information to and from the controller 140 through the host interface 200. This information is commands and data intended for directing the controller 140 to access the storage media 180 through flash interface 160. Data may be in the form of critical data or non-critical data. Upon receiving non-critical data from the host 12, the controller 140 under the direction of the host 12 writes the non-critical data in the MRAM LUNs memory arrays 380 and hybrid LUNs MRAM portion 300b, as dictated by the host 12. The controller 140 sends and receives information through its interface circuit 150, as does the devices 220 using its interface circuit 260 and as does devices 240 using its interface circuit 280. The interface circuits 150, 260, and 280 are therefore compatible.

The host 12 sends and receives information through the interface 200 using host commands whereas the controller 140 sends and receives information through the interface 160 using flash protocol, well known to those in the art.

In the embodiment of FIG. 11, the storage media 180 includes two types of memory devices, i.e. devices 220 and 240, with each of the devices 220 and 240 having distinct and complementary attributes. For example, the devices 240 are very high in performance and reliability and the devices 220 provide the majority of the capacity for the storage media 180 and are therefore high in capacity.

In one embodiment, controller 140 pre-configures the storage device 180 into a number of NAND LUNs memory arrays 360, MRAM LUNs memory arrays 380 and hybrid LUNs memory arrays 300 during the manufacturing of the storage device 1000 (also referred to herein as "mass storage device" 1000) based on some known knowledge of where and how these the devices 220 and 240 are being deployed (apriori information).

In another more versatile embodiment, the mass storage device 1000 reports its resources such as number and type of NAND flash memory devices 220 and MRAM devices 240 to the host 12 during the device initialization and the host 120 configures the mass storage device 100 according to its storage utilization requirements. The mass storage device 100 stores the configuration information in the storage device 180 and uses the same to report to the host 120 for the subsequent power-on cycles.

In yet another embodiment, both host and device store the configuration information and restore it during subsequent power on cycle based on some unique characteristics of the device such as Vendor ID, product ID and serial numbers.

FIG. 12 shows further details of the physical representation of the NAND array 320 of NAND flash memory devices 220 and the MRAM array 340 of MRAM devices 240. The NAND array 320 is shown made of NAND LUNs memory arrays 36 and of hybrid LUNs NAND portion 300*a*. The MRAM array 340 is shown made of MRAM LUNs memory arrays 380, and hybrid LUNs MRAM portion 300*b* in accordance with another embodiment of the invention. The hybrid LUNs memory arrays 300 is made of hybrid LUNs NAND portion 300*a* and hybrid LUNs MRAM portion 300*b* and is shown made of a number of hybrid LUNs memory arrays, such as hybrid LUN memory array 46 through the memory array of hybrid LUN 480. The hybrid LUN memory array 460 through the hybrid LUN memory array 480 may be of different size and be constructed of different combination of MRAM array 380 and NAND array 360. The NAND LUNs memory arrays 360 is shown partitioned into a number of NAND LUN memory array 400 through NAND LUN memory array 420. The MRAM LUNs memory arrays 380 is shown partitioned into a number of MRAM LUN memory array 500 through MRAM LUN memory array 520.

FIG. 13 shows an exemplary logical representation of memory arrays of LUNs 440, 430, and 450, each with distinct attributes. The hybrid LUN 440 is made of mixed memory array 460; hybrid LUN MRAM portion 460*b* and hybrid LUN NAND portion 460*a* and provides a mixed attribute LUN to the host 12. NAND LUN 430 is made of NAND LUN memory array 400 and only provides attributes associated with the NAND flash memory devices 220. MRAM LUN 450 is made of MRAM LUN memory array 500 and only provides attributes associated with MRAM devices 240.

FIG. 14 shows exemplary logical representation of different type of memory arrays of hybrid LUNs, in accordance with an embodiment of the invention. Each of the LUNs 540, 760, and 780 may be the hybrid LUNs including memory arrays 300 of FIG. 11. In FIG. 14, the hybrid LUN 540 is shown to include the MRAM memory array portion 560 on the lower logical block addresses (LBAs) and the NAND memory array portion 580 at the higher LBAs. The hybrid LUN 760 is shown to include the MRAM memory array portion 620 in the middle of the LBA range and two NAND memory array portions 600 and 640 at the lower and the higher LBA range of a LUN in accordance with another embodiment of the invention. The LUN 780 is shown to include two MRAM memory array portion 680 and 720 at two different LBA ranges and three NAND memory array portions 660, 700 and 740 at the lower, middle and upper LBA range of a LUN. These exemplary logical representations of different memory arrays of a LUN are to demonstrate that LUNs may of any size. Furthermore, MRAM memory array portion and NAND memory array portion of hybrid LUNs may be any size and occupy various portion of the LUN logical address space range.

FIG. 14 shows examples of logical block address (LBA) identifying the f LUNs. Some of the LUNs are shown to be contiguous and others are shown to be non-contiguous. For example, the LUN 540 includes the MRAM memory array portion 560 followed by the NAND memory LUN 580 whereas the LUN 780 includes the MRAM memory arrays interlaced with the NAND memory arrays. It is noted that either type of memory array can be a identified by any LBA based on the host's and/or the controller's utilization of the LUN. Similarly, the physical address space can reside non-continuously within the memory array. For example, the MRAM memory array portion 560 can include physical addresses that are non-sequential within the device 24. Similarly, the NAND memory array portion 580 can include physical block addresses that are non-sequential within the device 22.

FIG. 15 shows exemplary types of data stored by the host 12 in memory arrays of each of the LUNs 460, 400 and 500, in accordance with an embodiment of the invention. Exemplary information that is stored in the MRAM portion 460*b* of hybrid LUN 460 includes the operating system's file allocation tables (FAT), directories, and index structure which are frequently accessed and effect system performance. Exemplary information that is stored in the NAND portion 460*a* of the hybrid LUN 460 includes user data, which typically are not accessed as often as the type of data that is stored in the MRAM portion 460*b*, such as critical data. The NAND LUN 40 is made up of only NAND memory array and has to hold all associated with that LUN including FAT, directories and user data. The MRAM LUN 500 is all made up of high performance MRAM array and it should be used by the host to store the FAT, directories, enhanced user data, and database index structures. This LUN provides the highest performance and should be used by host accordingly.

FIG. 16 shows the steps performed by the device 1000 and the host 12 of FIG. 1 during initialization, in accordance with a method of the invention. These steps are initiated by the host 12 and directed to the controller 140 of the device 1000.

In FIG. 17, at 1001, the controller 140 discovers the number and type of memory arrays in device 1000 and reports them resources to the host 12, for example, whether and how many NAND devices 220 vs. MRAM devices 240 the storage media 180 has and next, at 1020, the host 12 configures the LUNs in the device 1000 in accordance with the usage requirements and the device resources. The device 1000 configures itself accordingly and stores the configuration file. Subsequently, at 1040, the device 1000 configures itself according to the stored configuration file and reports the configuration to the host 12.

Thus, in accordance with the various embodiments and methods of the invention, the storage device having different memory media, i.e. MRAM and NAND memories, is disclosed with the MRAM having an read and write access time that are substantially faster than that of the NAND memory. Further, MRAM does not require to be erased before it is re-programmed. Therefore, the need for tables and table management is eliminated. Applications benefiting from this approach are many some of which include those with small IO and partial page operations. Additionally, garbage collection and wear leveling are eliminated. Because MRAM has higher endurance and reliability and it does not require dynamic and static wear leveling, data remains in the media for a much longer time. NAND provides large amounts of capacity in a cost effective way. According to the foregoing, the storage device, such as the device 10, is advantageously capable of creating and managing LUNs with different attributes as a result of the combination of MRAM and NAND.

In some embodiments, the host configures the LUNs on the device based on the device resources and its requirements. Further, the host utilizes the LUNs based on their attributes and cleverly uses the MRAM LUN for critical data. Further, the host cleverly uses the NAND flash for non-critical data.

In one embodiment of the invention, the controller 14 manages the reserved area, such as the reserved area 36 in FIG. 1, as previously discussed, while the host manages the hybrid LUNs, such as the hybrid LUNs of the memory arrays 300 or 480 of FIG. 12.

It is contemplated that memory other than MRAM, having suitable performance and endurance, such as but not including, resistive RAM (RRAM), phase change memory (PCM), can be used in place of the MRAM devices 24 without departing from the scope and the spirit of the invention.

FIG. 17 shows a subsystem 800, in accordance with an embodiment of the invention, to include a host 12', a controller 14', a flash interface 16', and the storage media 18. The controller 14' is shown to include a NAND flash interface circuit 15', the storage media 18 is shown to include the NAND flash memory devices 22 and the magnetic random access memory (MRAM) devices 24. The subsystem 800 is analogous to the subsystem 10 of FIG. 1 except that the controller 14' of the subsystem 800 resides internally to the host 12'. Similarly, the circuit 15' being a part of the controller 14' resides within the host 12'.

It is understood that the circuit 14' may be other than a standard NAND flash interface circuit, such as DDR2, DDR3, DDR4, SPI, or any other industry standard or proprietary interface. This applies to the NAND flash interface circuits 15', 26, and 28. The interface 16' is of one interface and couples the interface circuit 15' to interface circuits 26 and 28. The NAND array 32 and the NAND LUNs memory arrays 36, in some embodiments, may be made of other than NAND, such as RRAM, phase change memory (PCM) or any other Non-volatile memory that posses substantially different characteristics to MRAM.

In some embodiment, interface circuits 26 and 28 are of different type. For example interface circuit 26 is a standard NAND interface and interface circuit 28 is DDR4. The interface circuit 15', in that embodiments, will support both different type of interface circuits 26 and 28 and interface 16' is made suitable to couple interface circuit 15' to interface circuits 26 and 28. The foregoing alternative embodiments apply to embodiments of the invention shown in and described relative to prior figures, such as the device 10 in FIG. 1.

NAND flash memory devices 22 and MRAM devices 24 are on the same die, in an embodiment of the invention. For these embodiments, a multi-chip package (MCP) is used to reduce real estate, increase speed and minimize power consumption. These attributes simplify layout and save valuable board space and highly desirable in the design of increasingly complex compact mobile devices such as smart phones and tablets. In the latter applications, additional memory types required by the host may be a part in a single MCP. For example, DRAM, SDRAM, LPDRAM, NOR or any other devices may be added to a single MCP package along with NAND and MRAM to provide all the memories required by a host of a mobile device (in mobile applications) to further reduce the real estate.

FIG. 18 shows an exemplary application of the various embodiments of the invention. In FIG. 18, a mobile device subsystem 1800 is shown to include in an exploded view thereof, the host 12' and the memory subsystem 1812. The memory subsystem 1812 is analogous to the embodiment of FIG. 17 except that the memory subsystem 1812 of FIG. 18 is shown to include a NOR flash 1806 and LPDRAM 1804 in addition to the storage media 18'. The storage media 12' is analogous to the storage media 18 and the host 12' is analogous to the host 12 except that the host 12' is equipped to communicate with the NOR flash 1806 and the LPDRAM 1804. In FIG. 18, the NOR flash 1806 is shown coupled to the host 12' through the NOR flash interface 1808 and the LPDRAM 1804 is shown coupled to the host 12' through the LPDRAM interface 1810. In an embodiment of the invention, the NOR flash 1806 and the LPDRAM 1804 are packaged in the same package as the storage media 18'. In another embodiment of the invention, the NOR flash 1806 and the LPDRAM 1804 are packaged in a different package than the storage media 18'.

As is readily known in the art, the NOR flash 1806 is an exemplary non-volatile memory and other types of non-volatile memory are contemplated. LPDRAM 1804 is an example of volatile memory and other volatile memory are contemplated.

In an embodiment of the invention, the host 12' typically uses the NOR flash 1806 to store code/software program and for direct execution in portable electronics devices, such as mobile phone subsystem 1800 and personal device assistants (PDAs). The host 12' additionally uses the NOR flash 1806 to configure these device. For today's full-featured cell phones, many designers are utilizing memory architectures that combine NOR type flash with NAND type flash for data storage, or NAND as the primary Flash memory in combination with low power memory, such as DRAM in which the program code can be shadowed and executed. In either case, the different types of memory are frequently stacked in Multi-Chip Packages (MCP) to create a single component. The host 12' utilizes the LPDRAM 1804 execution of code and temporary storage of data.

It is understood that "host", as used herein, refers to or includes central processing unit (CPU) well known to those in the art. The CPU executes programs that are stored in memory.

Although the invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A mobile device comprising:
hybrid reserved area spanning at least a portion of a first memory and a second memory, the first memory being distinct from the first memory;
a portion of the first memory or the second memory defining a Logical Unit (LUN); and
a controller communicatively coupled to the first and second memories, the controller operable to store at least a portion of critical data in the first memory of the LUN, wherein at least a portion of the critical data is stored in the first memory of the hybrid reserved area.

2. The mobile device of claim 1, wherein the LUN is mapped to a particular one of the first or the second memory, or a collection of the first and the second memory in accordance with utilization of the LUN.

3. The mobile device of claim 2, wherein the controller is operable to move the at least a portion of the critical data between the hybrid reserved area and the LUN.

4. The mobile device of claim 1, wherein the controller is coupled to a host to transfer host data therebetween and the host, through the controller, causes storage of the host data in the LUN.

5. The mobile device of claim 1, wherein the controller is operable to move the at least a portion of the critical data from the first memory to the second memory.

6. The mobile device of claim 1, wherein the critical data comprises tables, boot code, system data, host data, Meta data, or any combination thereof.

7. The mobile device of claim 1, wherein the first memory comprises magnetic random access memory (MRAM), resistive RAM (RRAM), or phase change memory (PCM).

8. The mobile device of claim 1, wherein the second memory comprises NAND or resistive RAM.

9. The mobile device of claim 1, wherein the controller is operable to cache the host data in the first memory of the hybrid reserved area.

10. The mobile device of claim 9, wherein the controller is operable to move at least a portion of the cached host data between the LUN and the first memory of the hybrid reserved area.

11. The mobile device of claim 10, further wherein upon the cached host data being re-written prior to being moved to the LUN, the controller being operable to over-write the cached host data.

12. The mobile device of claim 10, further wherein upon the cached host data being read prior to being moved to the LUN, the controller being operable to read the cached host data.

13. The mobile device of claim 9, wherein the controller is operable to cache adequate host data to perform a NAND flash full page program operation on the LUN.

14. The mobile device of claim 1, wherein the controller is operable to move the host data between the LUN and the first memory of the hybrid reserved area.

15. The mobile device of claim 1, wherein the first memory includes a first interface circuit and the second memory includes a second interface circuit and the controller is coupled to the first memory through the first interface circuit and the controller is coupled to the second memory through the second interface circuit.

16. The mobile device of claim 15, wherein the second interface circuit is a NAND interface and the first interface circuit is a DDR2, DDR3, or another NAND interface.

17. The mobile device of claim 1, wherein the controller is part of the host.

18. The mobile device of claim 1, further including a Low Power Dynamic Random Access Memory (LPDRAM).

19. The mobile device of claim 18, wherein the first memory, the second memory, and the LPDDR memory are integrated into a multi-chip package (MCP).

20. The mobile device of claim 1, wherein the controller, the first memory, and the second memory are integrated into a multi-chip package (MCP).

* * * * *